US 6,642,497 B1

(12) United States Patent
Apostolopoulos et al.

(10) Patent No.: US 6,642,497 B1
(45) Date of Patent: Nov. 4, 2003

(54) SYSTEM FOR IMPROVING IMAGE RESOLUTION VIA SENSOR ROTATION

(75) Inventors: John Apostolopoulos, San Carlos, CA (US); Fredrick Kitson, Livermore, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/173,330

(22) Filed: Jun. 14, 2002

(51) Int. Cl.[7] .............................................. H01L 27/00

(52) U.S. Cl. ................................. 250/208.1; 250/201.5

(58) Field of Search ........................... 250/208.1, 201.5, 250/201.4, 216; 348/583, 588, 333.11, 333.12, 222.1, 239; 382/299, 295–297

(56) References Cited

U.S. PATENT DOCUMENTS 5,561,460 A * 10/1996 Katoh et al. ............. 348/219.1

* cited by examiner

*Primary Examiner*—Que T. Le

(57) ABSTRACT

An image recording apparatus and method for using the same to generate a high-resolution image of a scene from a plurality of low-resolution images taken by the apparatus. The apparatus includes an array of image sensors and a lens for imaging the scene onto the array of image sensors such that each image sensor receives light from a different portion of the scene. The lens is rotationally symmetric about an optical axis that passes through the array of image sensors. The lens has a symmetric light collection function in which the portion of the scene that is imaged onto each of the image sensors depends only on the distance of the image sensor from the intersection of the optical axis. A plurality of low-resolution images taken at different angles of rotation are combined to form the high-resolution image.

11 Claims, 4 Drawing Sheets

SYSTEM FOR IMPROVING IMAGE RESOLUTION VIA SENSOR ROTATION

FIELD OF THE INVENTION

The present invention relates to imaging systems, and more particularly, to a method for improving the resolution of images.

BACKGROUND OF THE INVENTION

The present invention may be more easily understood with reference to imaging systems that utilize lens systems with very wide angles which are particularly useful in teleconferencing systems and the like. Such images capture essentially all of a scene in front of the camera without requiring that the camera be moved.

While such lenses are very useful, the resolution of the image produced thereby is often lacking in the regions of the image that originate at angles that are far from the center ray of the camera lens. A typical camera utilizing a fisheye lens consists of the lens with an image sensor such as a CCD array in the focal plane of the lens. The CCD array typically has a uniformly spaced array of pixels. Since the lens maps much larger solid angles to the pixels that are far from the center ray of the lens, these off-axis pixels have much poorer resolution than pixels near the optical axis. Hence, while the fisheye lens provides a large viewing solid angle, the usefulness of the image at the off-axis points is limited.

In principle, the image can be improved by combining a number of images to form a single image having improved resolution. This type of super-resolution system has been used with conventional lenses for some time. In the typical prior art super-resolution system, a series of images are taken at different camera positions. This is accomplished by moving the camera so that each image represents the image taken by a camera that is displaced relative to the previous location. If the direction of the optical axis is defined to be the z-axis, the camera is moved in the x and y directions. A number of such displaced images are then combined to form a single image having a resolution that is higher than any of the single images taken.

Unfortunately, this type of prior art super-resolution system is poorly suited to fisheye lenses. Since pixels represent the light collected from directions of space that subtend different solid angles, the complexity inherent in setting up and solving the super-resolution problem makes the application of the prior art methods very expensive as measured in computational time or storage requirements.

Broadly, it is the object of the present invention to provide an improved super-resolution system for use with lenses such as fisheye lenses.

These and other objects of the present invention will become apparent to those skilled in the art from the following detailed description of the invention and the accompanying drawings.

SUMMARY OF THE INVENTION

The present invention is an image recording apparatus and method for using the same to generate a high-resolution image of a scene from a plurality of low-resolution images taken by the apparatus. The apparatus includes an array of image sensors and a lens for imaging the scene onto the array of image sensors such that each image sensor receives light from a different portion of the scene. The apparatus also includes an actuator for rotating the image array about the optical axis. A controller reads-out the image array at each of a plurality of angles of rotation with respect to the optical axis to provide a plurality of low-resolution images that are combined to form the high-resolution image.

DETAILED DESCRIPTION OF THE PREFERRED EMBODIMENTS OF THE PRESENT INVENTION

Figure 1:
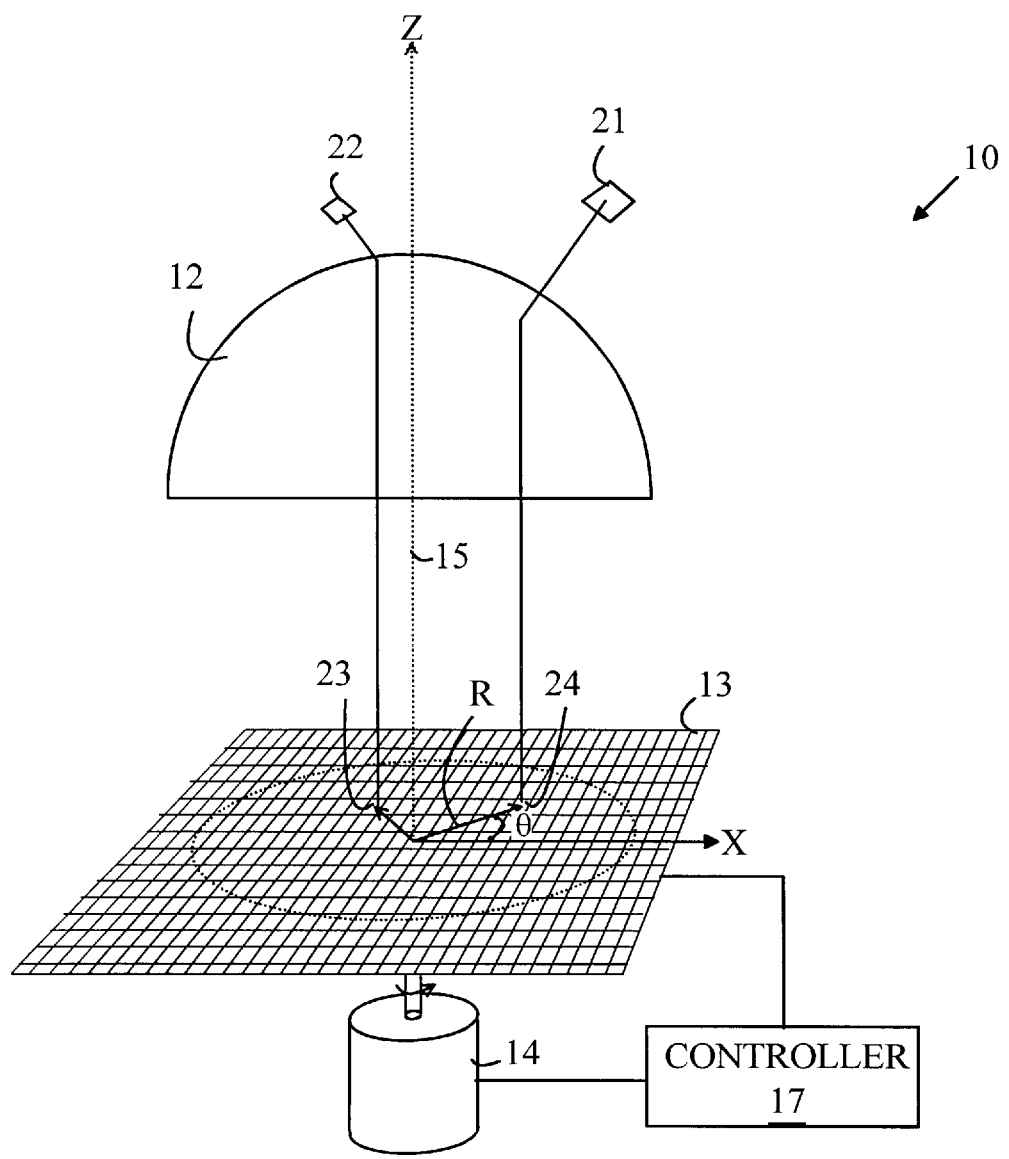
FIG. 1 is a schematic view of an image sensor 10 according to the present invention.

The manner in which the present invention provides its advantages can be more easily understood with reference to FIG. 1, which is a schematic view of an image sensor 10 according to the present invention. Image sensor 10 includes a fisheye lens 12 that forms an image on a pixilated image array 13. Array 13 may be constructed from any type of image sensors such as a CCD array or an array of CMOS photodiodes. Image sensor 10 also includes an actuator 14 that rotates image array 13 about the optical axis 15 of lens 12.

A controller 17 controls the movement of image array 13. In practice, image array 13 is used to record an image from lens 12, which is read-out into controller 17. The image array is then rotated about axis 15 by a small angle and another image recorded. This process is repeated a number of times until sufficient images have been recorded to allow controller 17 to compute a new image having a resolution greater than that of the individual images. Or it may continue to rotate and continue to acquire images and continue to improve the quality of the super-resolution image.

To simplify the following discussion, a Cartesian coordinate system is defined with the z-axis along the optical axis of lens 12. Image array 13 lies in the xy-plane of this coordinate system. Each pixel in the image array may be specified by specifying the distance from the origin, R, and the angle θ with respect to the x-axis.

Each pixel in the image plane measures the light that enters lens 12 from a solid angle that depends on the distance from the lens axis to that pixel. For example, pixel 24 collects light from the solid angle labeled 21, and pixel 23 collects the light that enters through the solid angle labeled 22. The size of the solid angle corresponding to each pixel depends only on the distance R from the axis of lens 12 to the pixel in question. Accordingly, when the image array is rotated about the lens axis, the size of the collection solid angle for each pixel remains the same. This substantially simplifies the complexity required to compute an improved resolution image from the various lower resolution images recorded at each rotational angle.

The image recorded by the image array at each rotational angle, A, can be denoted by $P(r_i, t_i, A)$, where $(r_i, t_i)$ is the polar coordinate in the xy-plane of the $i^{th}$ pixel in the imaging array. The goal of the super-resolution algorithm is to compute the image that would have been recorded by an image sensor having a higher density of imaging elements.

For example, if each pixel in array 13 were divided into 4 sub-pixels, the algorithm combines a number of images to generate the pixel values that would have been recorded by the finer pixel array, $f(R_j, \partial_j)$, at one of the angles. Generally, at least 4 images must be combined to provide the higher resolution image. Here $(R_j, \partial_j)$ is the polar coordinate in the xy-plane of the $j^{th}$ point in the finer grid.

For any angle $A_k$, each of the measured pixel values, $P(r_i, t_i, Ak)$ may be written as a weighted sum of a number of pixel values in the finer pixel array. The relationship between the low resolution pixels and the high resolution pixels may be written in the form:

$$P(r_i, t_i, A_k) = \sum_j f(R_j, \partial_j,) h_k(R_j, \partial_j; r_i, t_i) \quad (1)$$

Here, $h_k$ is the impulse response for the $k^{th}$ rotation angle. If the lens is circularly symmetric, it can be shown that Eq. (1) can be rewritten as follows:

$$P(r_i, t_i, A_k) = \sum_j f(R_j, \partial_j,) H(R_j, r_i, \partial_j + A_k - t_i) \quad (2)$$

It should be noted that H is the same for all angles of rotation. That is, H varies only along the radial direction and is invariant along the angular direction.

Consider the case in which the various low-resolution images were obtained by moving the sensor linearly in the x and y directions instead of by rotating the sensor. Each low resolution image would be taken at a sensor position $(dx_k, dy_l)$. In this case, the corresponding relationship between the low-resolution and high-resolution images would be of the form:

$$P(x_i, y_i, dx_k, dy_l) = \sum_X \sum_Y f(X, Y) h_{k,l}(X, Y; x_i, y_j) \quad (3)$$

That is, each displacement $(dx_k, dy_l)$ would require a different impulse response. The computational resources required to solve the system of equations represented by Eq. (3) are substantially greater than those required to solve the system of equations represented by Eq. (2).

The set of linear equations defined by Eq. (2) can, in principle, be solved for the f values, provided P is measured at a sufficient number of angles. Mathematical algorithms for solving such systems are known to the art. For example, the method of projection on convex sets may be employed to solve the resulting system of equations. The reader is referred to Digital Video Processing by M. Tekalp (Prentice Hall, 1995, ISBN 0-13-190075-7) for a detailed discussion of such algorithms.

In practice, the size of the set of equations is quite large. For example, if the finer array is to have 1000×1000 pixels, the set of equations that must be solved contains one million equations, and the corresponding matrices have $10^{12}$ entries. Fortunately, most of the entries are zero. However, even the problem of storing the non-zero entries can be significant unless there is some relationship between the weight functions in each of the equations. The fact that each image is obtained by rotating the sensor array around the axis of symmetry of the lens provides the required simplification in the present invention. As noted above, such a simplification is not possible if the images are related to one another by linear translations of the image array.

In addition to reducing the computational complexity, the method of the present invention also reduces the problems introduced by the portions of the image near the edges of the image array. In prior art systems, a plurality of low-resolution images are formed by translating the image array a short distance in the x or y directions. That is, images are taken for the array centered at locations on some grid (ndx, mdy) for various integer values of n and m. Since the image array has a fixed size, the low-resolution images have different fields of view. That is, each image is a portion of a larger scene. Each image has a center region corresponding to n=m=0 that is shared by the other images; however, the edges of an image may include data from parts of the larger scene that are not seen in any other low-resolution image. Accordingly, there is less information for the edge pixels, and hence, the image improvement that can be provided at the edges is less than that provided in the central region. In the case of a fisheye lens, it is the outer pixels that require the improvement, not the central pixels; hence, the prior art methods provide less than ideal results. In addition, since some of the edge pixels view parts of the overall scene that are not seen by any other pixels, artifacts can be generated in the outer regions of the high resolution image that depend on the contents of the larger scene near the image boundaries.

The above-described embodiments of the present invention assume that the imaging lens is a fisheye lens. For a fisheye lens, the area that has the poorest sampling rate, is the area at the periphery of the field of view. This is precisely the region of the high-resolution image that has the greatest improvement in resolution over the low-resolution images in the present invention. The present invention specifically provides additional samples in that area, and those samples are uniformly spaced apart (via the angle of rotation). Accordingly, the present invention is well matched to a fisheye lens in that it provides nicely spaced samples specifically in the areas where they are most needed. However, the benefits of the present invention can be realized with any lens in which the solid angle sampled by each pixel depends only on the distance of the pixel from the optical axis of the lens, i.e., a circularly symmetric lens.

While the computational simplifications provided by the present invention depend on a circularly symmetric lens, the present invention can provide benefits in systems that do not have such lenses. The mechanical mechanisms required to rotate a sensor in a continuous manner are, in general, much simpler than those required to move the sensor back and forth in both the horizontal and vertical directions. In addition, a sensor can be rotated much faster than the sensor can be moved back and forth in a rectilinear manner. Hence, an image recording system according to the present invention can provide advantages even with non-circularly symmetric lenses.

The above-described super-resolution algorithms assume that the scene captured in each of the low-resolution images is the same. If the scene varies in time, the individual images must be compensated for the motion or the new imagery that occurs in each image. Super-resolution algorithms that compensate for motion or new imagery in the scene are known to the art, and hence, will not be discussed in detail here.

The rotation of the sensor can be in discrete steps or the sensor can be rotated in a continuous fashion if the image array has sufficient speed to capture an image before the sensor has rotated too far. CMOS image sensors that can capture images at frame rates of 1000 to 10,000 frames/sec have been demonstrated. Hence, the present invention can be used to provide high-resolution video using such sensors by capturing and processing 10 to 100 low-resolution images to provide each super-resolution image that is outputted in real time at a conventional frame rate of 30 or 60 frames/sec. It should be noted that these high-speed sensors often have limited spatial resolution or low signal-to-noise ratios; hence, the present invention provides a means for exploiting the strength of these sensors while correcting for their weaknesses.

Embodiments of the present invention that provide high-resolution video output can also be practiced. Consider an embodiment in which the sensor rotates in one direction acquiring one low-resolution frame at each of a predetermined set of rotation angles. Each new low-resolution image is combined with a predetermined number of previously acquired images to provide a new high-resolution image that is output as a high-resolution frame of the video stream.

Figure 2:
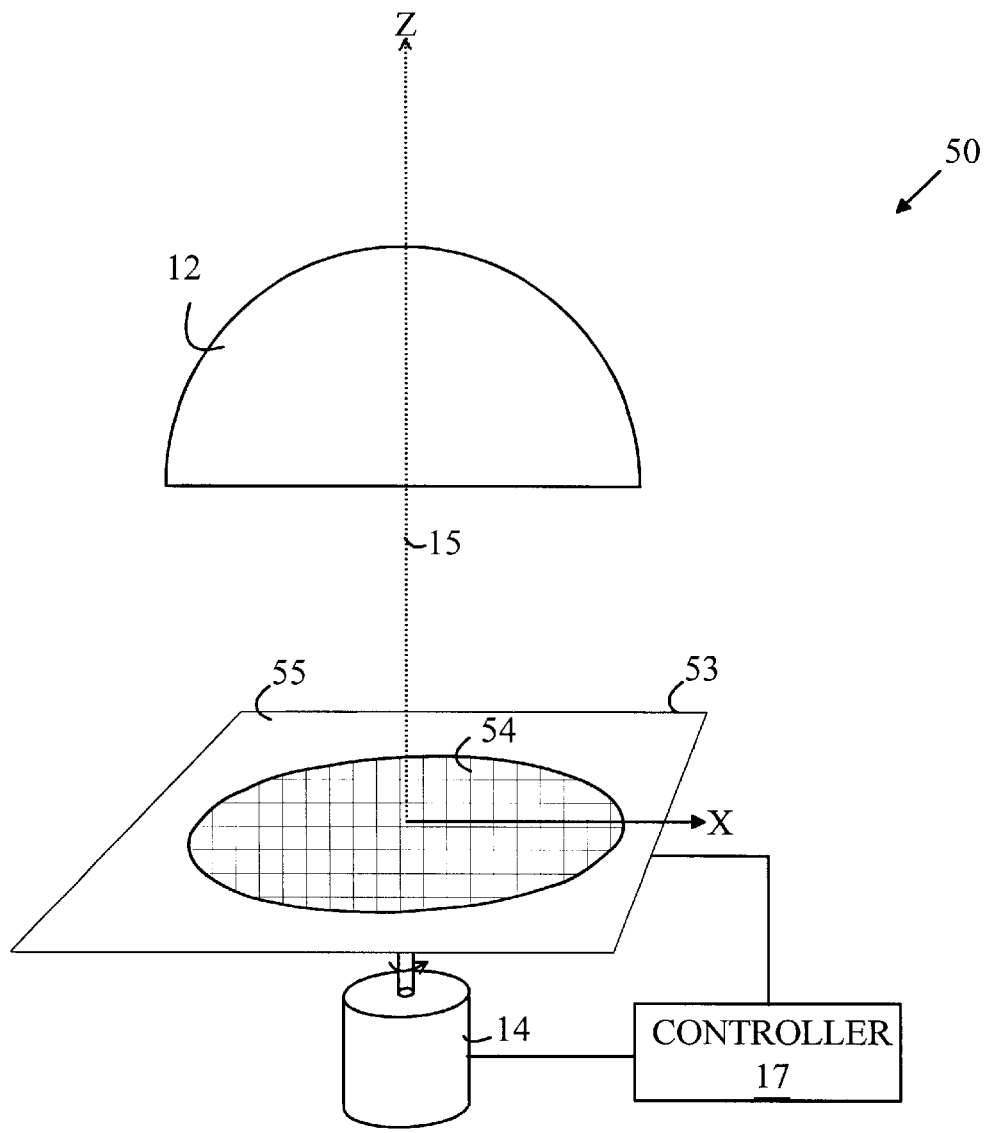
FIG. 2 is a schematic view of an image sensor 50 according to another preferred embodiment of the present invention.

The embodiments of the present invention described above utilize a square or rectangular sensor array. However, sensor arrays having other shapes can be utilized. Since only the center portion of the image array is needed, the remaining area can be utilized for other circuitry or left vacant to improve fabrication yield. For example, a circular sensor array may be advantageously utilized as shown in FIG. 2. Image sensor 50 utilizes an imaging array 54 that is circular in shape. The array may be part of a larger chip 53 having an arbitrary shape. The area 55 that is outside of array 54 may be utilized for other circuitry. Since array 54 occupies less space on chip 53, the chip yield, and hence, chip cost, are reduced.

Figure 3:
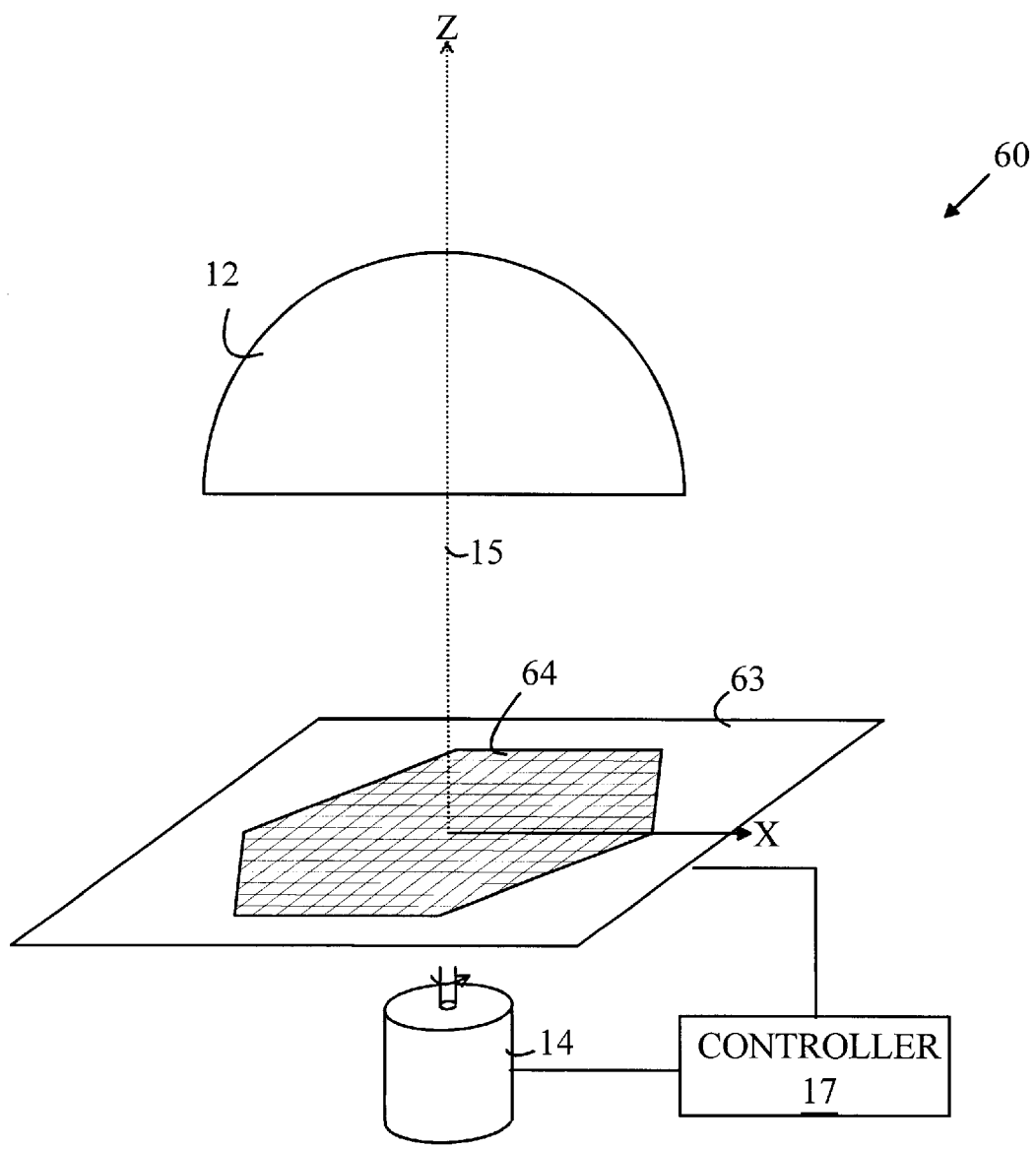
FIG. 3 is a schematic view of an image sensor 60 according to another preferred embodiment of the present invention.

Similarly, a hexagonal image array 64 may be utilized as shown in FIG. 3. Once again, the free area outside of the chip 63 can be utilized for image processing circuitry or left blank to improve the device yield.

Alternatively, the chip shape may be matched to the image array shape (e.g. circular or hexagonal) in order to provide a number of benefits. For example, a chip shape of this form may simplify the rotation of the chip or image array. Also, a chip shape such as hexagonal or circular may increase the number of sensors fabricated per wafer since it enables a denser packing of chips on a wafer.

Figure 4:
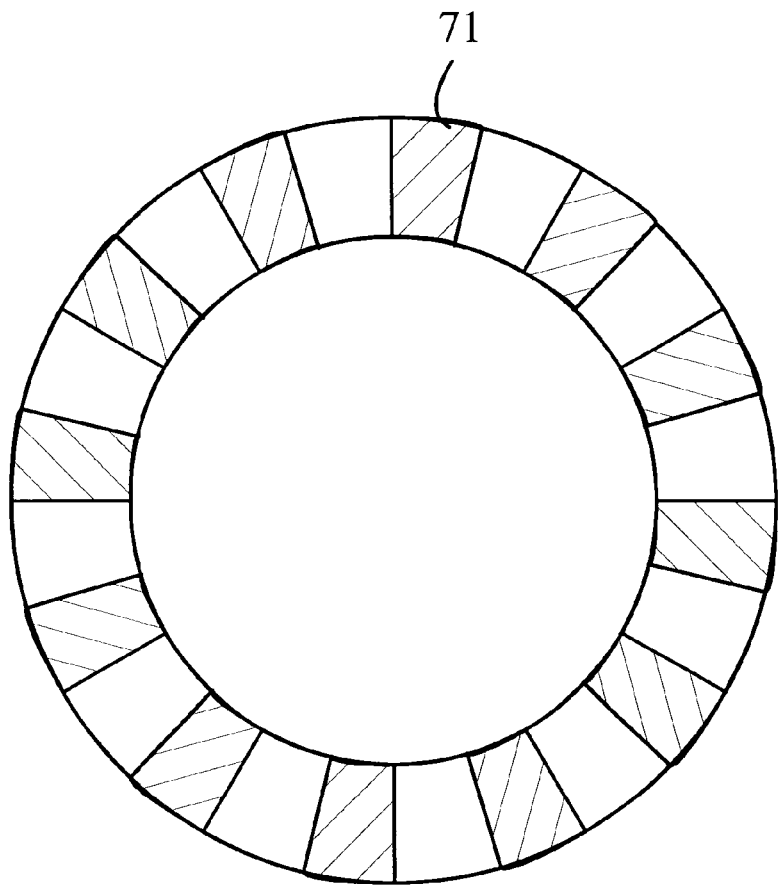
FIG. 4 illustrates another configuration for the image sensors.

The above-described embodiments utilize an image sensor array in which each image sensor is assumed to be square. However, image sensors of other shapes can be utilized. For example, image sensors whose shape corresponds to segments within two concentric circles, as shown in FIG. 4 at 71, can be utilized. In general, the shape and area of all the individual sensors at a given radius from the center of rotation is typically the same, however the shapes and areas of individual sensors may differ for sensors at different radii.

Various modifications to the present invention will become apparent to those skilled in the art from the foregoing description and accompanying drawings. Accordingly, the present invention is to be limited solely by the scope of the following claims.

What is claimed is:

1. An apparatus comprising:
   an array of image sensors;
   a lens for imaging a scene onto said array of image sensors such that each image sensor receives light from a different portion of said scene;
   an actuator for rotating said image array about said optical axis; and
   a controller for reading-out said image array at each of a plurality of angles of rotation with respect to said optical axis to provide a plurality of low-resolution images.

2. The apparatus of claim 1 wherein said actuator continuously rotates said image array.

3. The apparatus of claim 1 wherein said lens is rotationally symmetric about an optical axis that passes through said array of image sensors and having a symmetric light collection function such that said portion of said scene that is imaged onto each of said image sensors depends only on the distance of said image sensor from the intersection of the optical axis of said lens and said array of image sensors.

4. The apparatus of claim 3 wherein at least two of said image sensors receive light from portions of said scene of different sizes.

5. The apparatus of claim 1 wherein said controller also generates an image of said scene by combining said plurality of said low-resolution images.

6. The apparatus of claim 1 wherein said lens is a fisheye lens.

7. A method for generating a high-resolution image of a scene, said method comprising:
   providing an array of image sensors;
   forming a plurality of low-resolutions of said scene with a lens having an optical axis, each of said low-resolution images corresponding to a different angle of rotation of said image array about said optical axis; and
   combining said low-resolution images to form said high-resolution image.

8. The method of claim 7 wherein a new high-resolution image is generated by combining a newly formed low-resolution image with a predetermined number of previously formed low-resolution images.

9. The method of claim 7 wherein said lens has rotational symmetry about said optical axis and has a symmetric light collection function such that the size of said portion of said scene that is imaged onto each of said image sensors depends only on the distance of said image sensor from the intersection of the optical axis of said lens and said array of image sensors.

10. The method of claim 9 wherein at least two of said image sensors receive light from portions of said scene of different sizes.

11. The method of claim 10 wherein said lens is a fisheye lens.

* * * * *